US007902848B2

(12) United States Patent
Eccleston et al.

(10) Patent No.: US 7,902,848 B2
(45) Date of Patent: Mar. 8, 2011

(54) REVERSIBLE TEST PROBE AND TEST PROBE TIP

(75) Inventors: Larry Eccleston, Everett, WA (US); Chris W. Lagerberg, Seattle, WA (US); John Renner, III, Arlington, WA (US); David J. Gibson, Sr., Everett, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 12/351,696

(22) Filed: Jan. 9, 2009

(65) Prior Publication Data

US 2010/0176828 A1 Jul. 15, 2010

(51) Int. Cl.
*G01R 31/20* (2006.01)

(52) U.S. Cl. .............................. 324/754.03; 324/754.01

(58) Field of Classification Search .......... 324/754–765, 324/158.1

See application file for complete search history.

(56) References Cited

U.S. PATENT DOCUMENTS

| | | | | |
|---|---|---|---|---|
| 2,857,572 | A * | 10/1958 | Belart | 324/149 |
| 2,957,156 | A * | 10/1960 | Gatto et al. | 439/166 |
| 3,363,221 | A * | 1/1968 | Stark | 439/585 |
| 3,893,027 | A | 7/1975 | Veenendaal | 324/72.5 |
| 5,395,264 | A * | 3/1995 | Keith | 439/502 |
| 5,414,346 | A | 5/1995 | Mohan | 324/72.5 |
| 5,691,635 | A | 11/1997 | Pot et al. | 324/115 |
| 6,062,884 | A * | 5/2000 | Messimer et al. | 439/172 |
| 6,384,614 | B1 | 5/2002 | Hager et al. | 324/754 |
| 6,400,167 | B1 * | 6/2002 | Gessford et al. | 324/754 |
| 7,009,377 | B2 * | 3/2006 | Campbell et al. | 324/72.5 |
| 7,015,709 | B2 * | 3/2006 | Capps et al. | 324/754 |
| 7,114,970 | B2 * | 10/2006 | Head | 439/191 |
| 7,161,344 | B2 | 1/2007 | Kwark | 324/72.5 |
| 7,221,179 | B1 * | 5/2007 | Campbell | 324/761 |

OTHER PUBLICATIONS

Fluke Test Tools Catalog; vol. One; 2007; pp. 1-72.

* cited by examiner

*Primary Examiner* — Ha Tran T Nguyen
*Assistant Examiner* — Richard Isla Rodas
(74) *Attorney, Agent, or Firm* — Dorsey & Whitney LLP

(57) ABSTRACT

A reversible test probe and test probe tip. In one embodiment, a test probe tip is reversible relative to a test probe body. The reversible probe has a first probe tip at a first end and a second probe tip at a second end. The test probe body has an opening operable to receive the first probe tip and the second probe tip. When the first probe tip is positioned in the opening, the first probe tip is electrically coupled to a metal device in the test probe body. When the second probe tip is positioned in the opening, the second probe tip is electrically coupled to a metal device in the test probe body. In another embodiment, a test probe having two test probe tips is reversible relative to a test lead.

16 Claims, 5 Drawing Sheets

REVERSIBLE TEST PROBE AND TEST PROBE TIP

TECHNICAL FIELD

This invention relates generally to test instrument probes, and more specifically one or more embodiments relate to reversible probes and probe tips.

BACKGROUND OF THE INVENTION

This invention relates generally to test instrument probes, and more specifically to reversible test probes and probe tips.

Test instruments, such as multimeters, voltage meters, oscilloscopes and the like, are used to measure electrical parameters in various electrical devices. FIG. 1 illustrates an exemplary test instrument 100. The test instrument 100 has a test probe 102 that is coupled to an input/output 104 of the test instrument 100. The test probe 102 has a test lead 106 having a first end 108 that is coupled to the input/output 104 of the test instrument 100 and a second end 110 that is coupled to a probe body 112. The probe body 112 includes a tip 114, which is coupled to a test point (not shown) of a device (not shown) to be measured or tested. As will be clear to a person having ordinary skill in the art, a second test probe (not shown) may be coupled to output 105.

In general, different test probe tips are used for various test applications. In fact, the International Electrotechnical Commission (IEC) under the guidance of Technical Committee (TC66) generated a safety standard for Test and Measurement Equipment related to test probes referenced as IEC-61010-031. This standard specifies requirements for test probe tips 114 for various test applications. For instance, the safety standard specifies the length of the exposed metal tip of the probe used in industrial applications, referred to as category III (CAT III) and category IV (CAT IV) installation, must be less than 4 mm in length. The probe tip for low energy applications, such as used in household applications or category II (CAT II) installations, must be less than 18 mm in length. Having a probe tip with exposed metal 18 mm in length is important because this allows users to easily insert the probe tip into a standard wall socket for quick and accurate measurement, which is not possible with a 4 mm probe tip. For industrial applications (CAT III and CAT IV) where high energy exists, a reduced probe tip of 4 mm is important to help reduce risk of arcs and arc flash hazards, which is not an issue in CAT II environments.

In the past, to accommodate the need for different length probe tips, various test probe assemblies having different probe tip lengths were used with test instruments. For instance, a user may have two sets of test probes, one probe set with probe tip lengths for testing high energy applications and another probe set with probe tip lengths for testing low energy applications. However, this resulted in the user having to manage two sets of test probes. Often test points are located in an obstructed location and having multiple probes can result in problems for a user when switching out the different probes. For instance, the user may have difficulty carrying the extra probes or the equipment may put the user in an awkward position so that it is a challenge to change out the probes. Additionally, by having separate test probes, the user may misplace, drop, or lose the probes so that the appropriate probe is not available when needed.

More recently, however, test probes have been designed with probe tips that can be removed from the probe holder or body. Thus, rather than replacing the entire probe assembly, only the probe tip needs to be replaced. Consequently, the probe tips are easier to carry since the tip is much smaller than the entire probe assembly. However, removeable probe tips still require that the user carry an extra set of probe tips for various test applications. Therefore, the removeable tips still result in the situation where the user may not have the appropriate probe tips available when needed or the user may drop or lose the tips.

There is, therefore, a need for a test probe that does not require separate probe tips to be carried for use on various test applications.

SUMMARY OF THE INVENTION

The present application is directed toward test probes having reversible probe and/or probe tips. In one aspect of the invention, a reversible test probe tip includes a conductive member having a longitudinal length with a distal end and a proximal end. The distal end defines a first electrically conductive tip operable to be coupled to a test point of a device to be tested, and the proximal end defines a second electrically conductive tip operable to be coupled to a test point of the device. The first tip and the second tip are operable to be removeably secured to and electrically coupled to a test probe body. The reversible test probe tip further includes an insulative member that surrounds a middle portion along the longitudinal length of the conductive member.

In another aspect of the invention, a test probe includes a test lead and a probe body coupled to the test lead at one end and having an opening at the other end. In addition, the test probe includes a reversible probe tip having a conductive member with one end defining a first electrically conductive tip operable to be coupled to a first test point of a device to be tested and another end defining a second electrically conductive tip operable to be coupled to a second test point of the device to be tested. The first and second tips configured to be positioned in the opening of the probe body. The probe body has a metal structure positioned within its opening. The metal structure is operable to provide electrical communication between the test lead and the first tip when the first tip is positioned within the opening and between the test lead and the second tip when the second tip is positioned within the opening.

In another aspect of the invention, a test probe includes a conductive member having a longitudinal length with a distal end and a proximal end. The distal end defines a first electrically conductive tip operable to be coupled to a first test point of a device to be tested, and the proximal end defines a second electrically conductive tip operable to be coupled to a second test point of the device to be tested. The test probe further includes a test lead and an insulative member that surrounds a middle portion along the longitudinal length of the conductive member. The test lead has a recess operable to receive the first tip and the second tip. The test lead includes a metal device in the recess that is operable to provide electrical contact between the first tip and the test lead when the first tip is positioned in the recess and between the second tip and the test lead when the second tip is positioned in the recess.

DETAILED DESCRIPTION OF PREFERRED EMBODIMENTS

Embodiments of the present invention are directed toward probes used with test and measurement equipment, and more particularly, to test probes having reversible probe and/or probe tips. Certain details are set forth below to provide a sufficient understanding of the embodiments of the invention. However, it will be clear to one skilled in the art that various embodiments of the invention may be practiced without these particular details.

Figure 2:
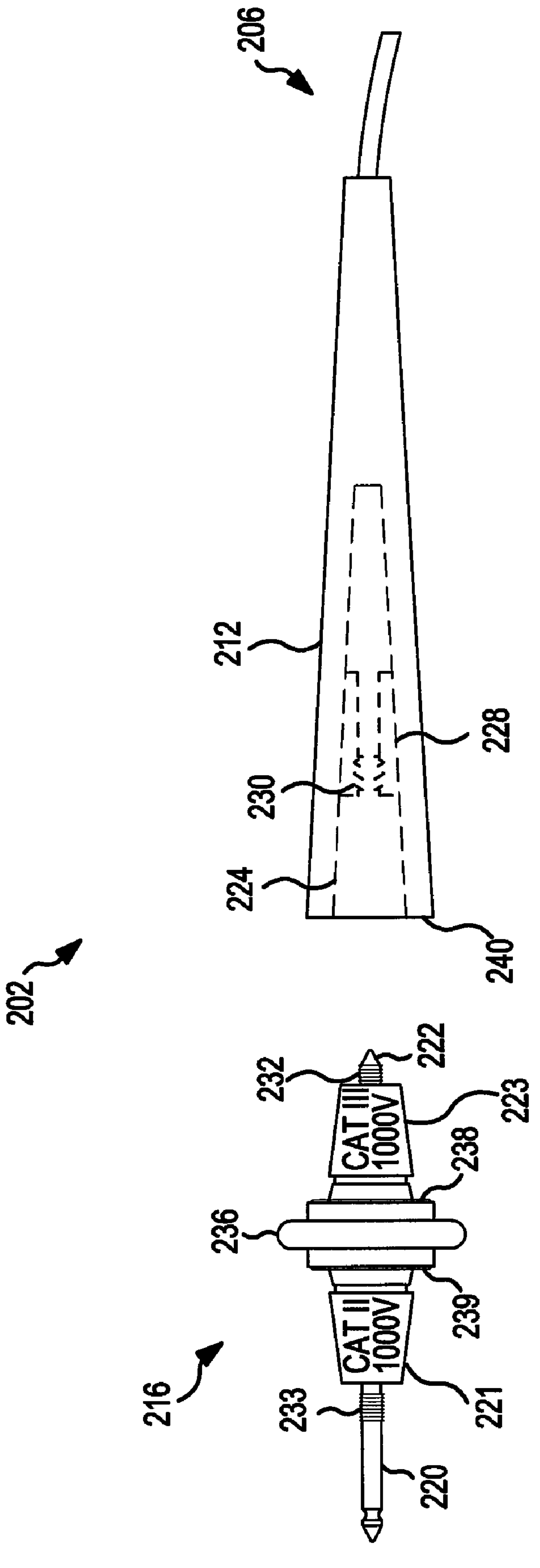
FIG. 2 is a schematic drawing of a test probe according to one embodiment of the invention.

FIG. 2 illustrates a test probe 202 according to one embodiment of the invention. In particular, the test probe 202 includes a test lead 206, a probe body 212, and a reversible tip 216. In FIG. 2, the reversible tip 216 is shown separated from the probe body 212. The reversible tip 216 has a first probe tip 220 and a first handle portion 221 at one end and a second probe tip 222 and a second handle portion 223 at the other end. The first probe tip 220 and the second probe tip 222 are made from an electrically conductive material and are in electrical communication with each other. In some embodiments, the first probe tip 220 and second probe tip 222 are formed from the same conductive member that extends through the first handle portion 221 and the second handle portion 223. Each probe tip 220 and 222 are coupleable to a test point (not shown) of a device (not shown) to be tested.

The probe body 212 is coupled to the test lead 206 at one end and has an opening 224 at the other end. As discussed above, the test lead 206 may be coupled to an output of a test instrument (not shown). The opening 224 has a diameter sufficient to receive the first and second handle portions 221 and 223. Although the opening 224 shown in FIG. 2 is tapered, it will be clear to a person having ordinary skill in the art, that the opening can be of any configuration sufficient to accept a handle portion and a probe tip of a reversible tip, such as a nontapered opening or an opening having many different diameters. The opening 224 extends longitudinally along the probe body 212 to a depth sufficient to receive the longest probe length on a reversible tip.

The reversible tip 216 is reversible relative to the probe body 212. For instance, the first probe tip 220 and first handle portion 221 may be inserted into the opening 224 of the probe body 212 so that the second probe tip 222 and second handle portion 223 extend from a surface 240 of the probe body 212. In this position, a first surface 239 of the first handle portion 221 abuts the outer surface 240 of the probe body 212. Conversely, the second probe tip 222 and second handle portion 223 may be inserted into the opening 224 of the probe body 212 so that the first probe tip 220 and the first handle portion 221 extend from the probe body 212. In this position, a second surface 238 of the second handle portion 223 abuts the outer surface 240 of the probe body 212. As will be discussed further below, the reversible tip 216 is mechanically secured to the probe body 212.

In some embodiments the reversible tip 216 may include a finger guard 236 to aid in preventing your hand from slipping into the exposed probe tip when the probe is being used. The first handle portion 221, the second handle portion 223, and the finger guard 236 are made from an insulative material. This allows the user to touch the handle portions 221 and 223 when positioning the reversible tip 216 into the opening 224 of the probe body 212.

A conductive device 228, such as a metal band, is positioned within the opening 224 of the probe body 212. The metal device 228 is electrically coupled to the test lead 206, which as discussed above provides electrical communication to an output of a test instrument. Additionally, the metal device 228 is electrically coupleable to the first probe tip 220 when the first probe tip 220 is positioned within the opening 224 of the probe body 212 and the second probe tip 222 when the second probe tip 222 is positioned within the opening 224 of the probe body 212. For instance, when the second probe tip 222 is placed into opening 224 of the probe body 212, a contact portion 232 of the second probe tip 222 is electrically coupled to a contact portion 230 of the metal device 228. The contact portion 232 of the second probe tip 222 and the contact portion 233 of the first probe tip 220 may be coupled to the contact portion 230 of the metal device 228 in the probe body 212 by any means sufficient to provide electrical connection. For instance, in the embodiment shown in FIG. 2 the electrical connection is formed by a screw type mechanism. In this embodiment, the first probe tip 220 has threads and the second probe tip 222 has threads that mate with threads 230 of the metal device 228 positioned within the probe body 212. This connection mechanically and electrically couples the probe tip 216 to the probe body 212. However, other configurations may be used that provide sufficient electrical and mechanical connection between the probe tip and the metal device, such as a snap connector, a press fit or combination of the two.

FIG. 2 shows the handle portions 221 and 223 labeled as CAT II and CAT III, respectively. This labeling indicates to the user that the first probe tip 220 has a probe length that is required for category II applications, and the second probe tip 222 has a probe length that is required for category III applications. Although FIG. 2 shows the first probe tip 220 having a probe length that is different from the probe length of the second probe tip 222, the reversible tip may have a first probe tip and a second probe tip of relatively equal lengths. Additionally, the ends of the reversible probe tip may have varying configurations, such as alligator clip, needle point, or the like. For instance, one end of the reversible probe tip may have an alligator clip while another end of the reversible probe tip may have a needle point. Thus allowing the user to readily switch out probe tips for various applications.

Figure 1:
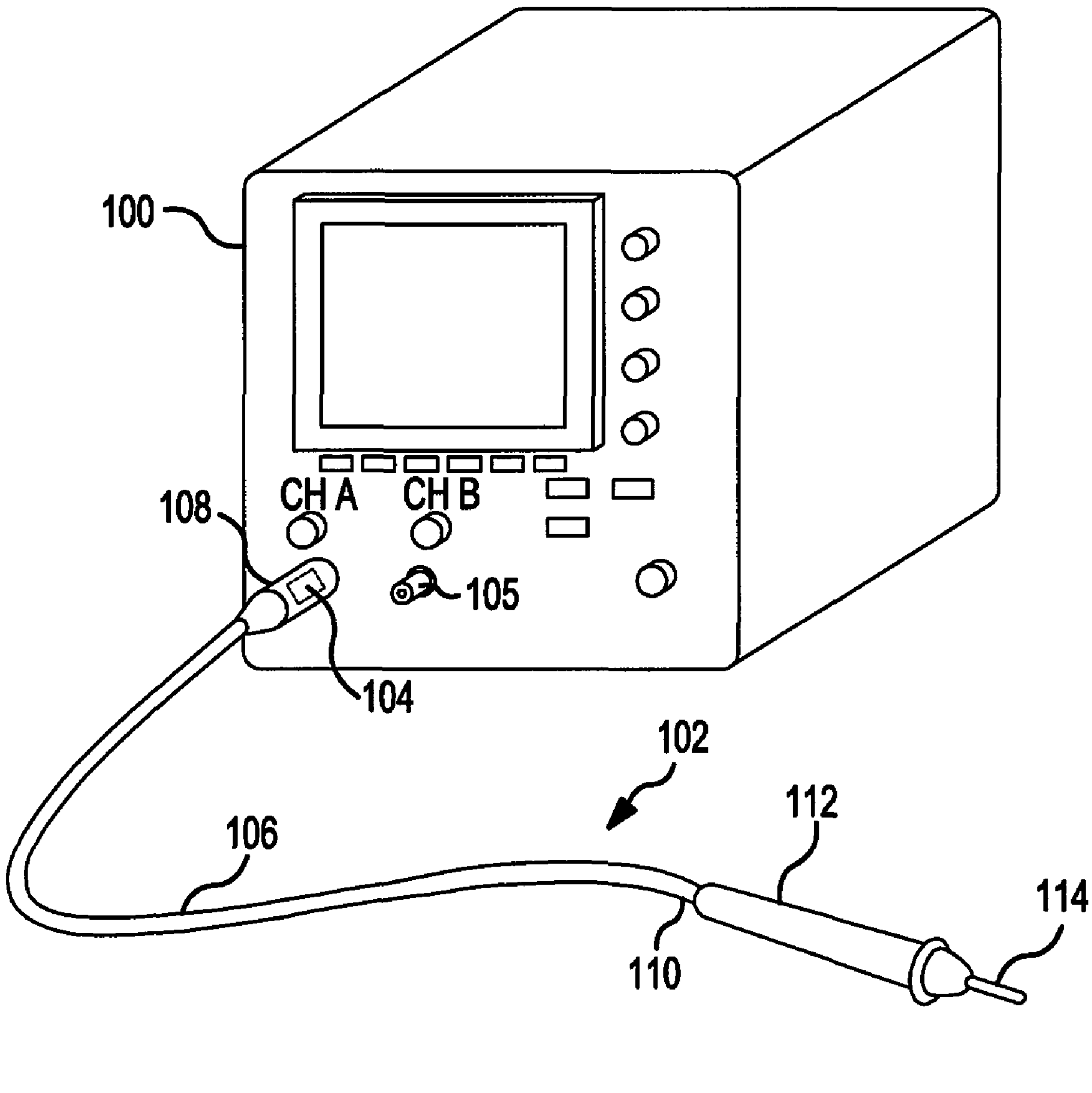
FIG. 1 is a schematic drawing of a test instrument in accordance with prior art.
Figure 3A:
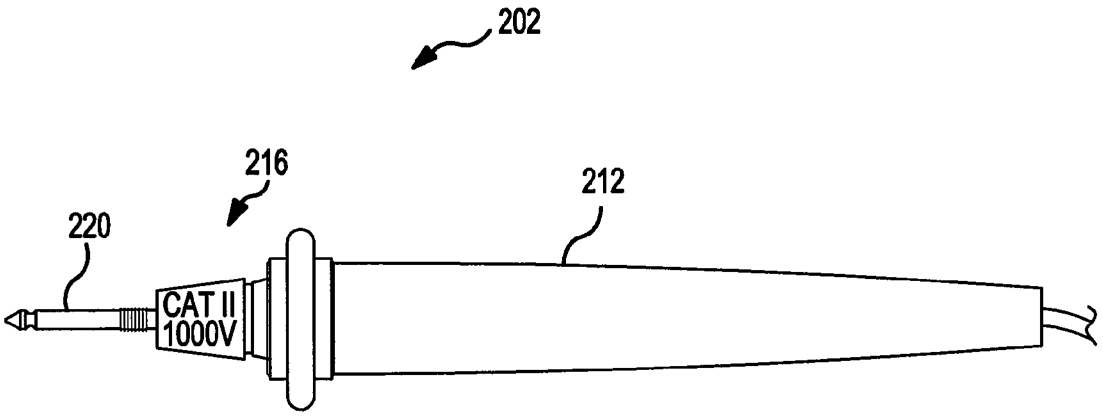
FIG. 3A is a schematic drawing of a test probe according to one embodiment of the invention.
Figure 3B:
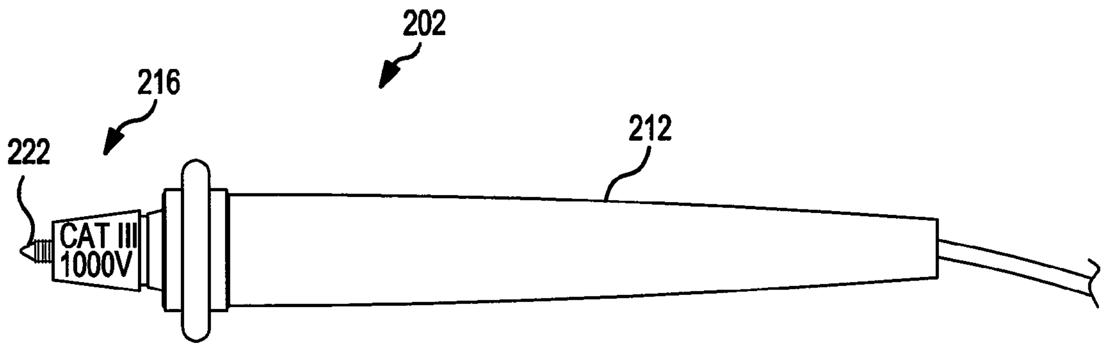
FIG. 3B is a schematic drawing of a test probe according to one embodiment of the invention.

FIG. 3A shows the probe 202 having the reversible tip 216 coupled to the probe body 212 with the first probe tip 220 exposed. In this embodiment, the second probe tip 222 in FIG. 1 is electrically coupled to the contact portion 230 of the metal device 228 shown in FIG. 1 in the probe body 212. FIG. 3B shows the probe 202 having the reversible tip 216 coupled to the probe body 212 with the second probe tip 222 exposed. In this configuration, the first probe tip 222 from FIG. 1 is electrically coupled to the contact portion 230 of the metal device 228 in the probe body 212. By having a probe with a reversible probe tip, a user may easily change probe tips for various applications. For instance, the user may change probes for various energy level applications, such as CAT II and CAT III shown in FIGS. 2 and 4, or the user may change probes tips for various shaped probe tips as discussed above.

Figure 4:
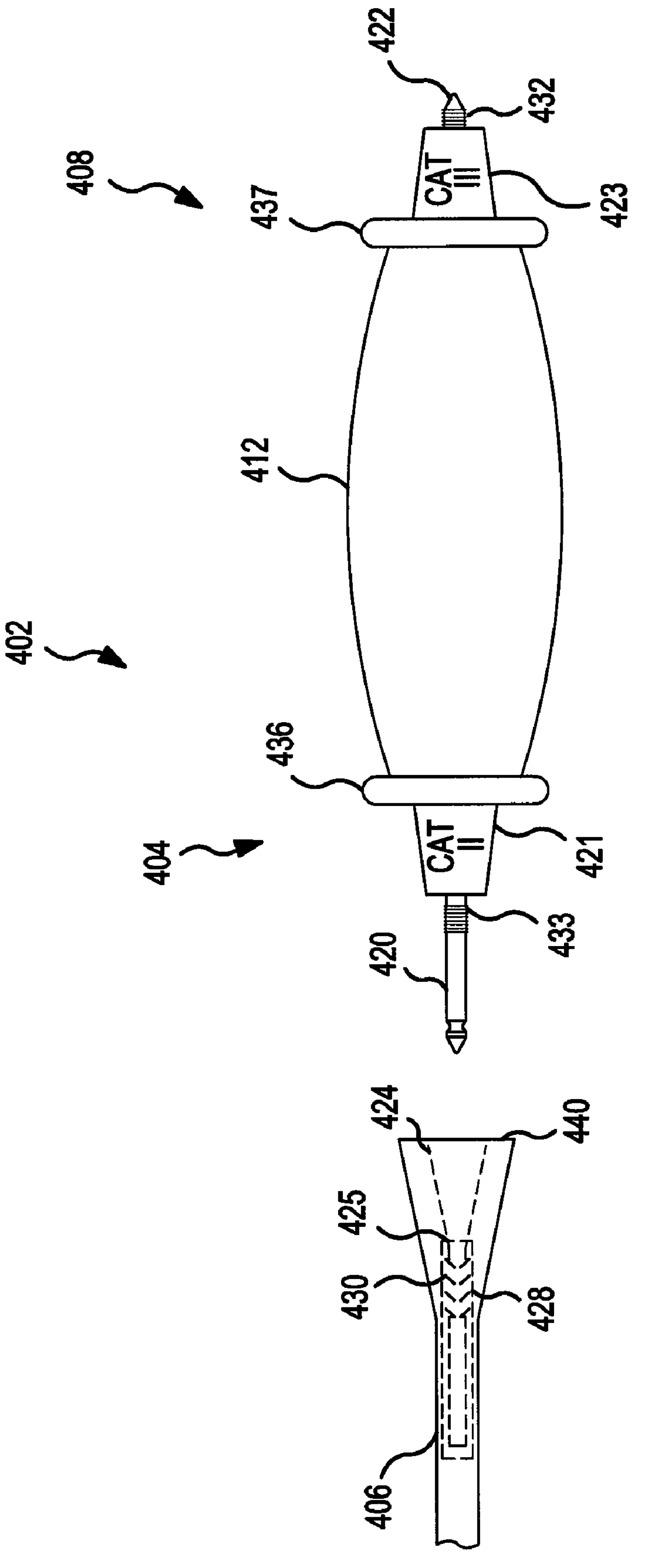
FIG. 4 is a schematic drawing of a test probe according to one embodiment of the invention.

FIG. 4 illustrates a test probe assembly 402 according to another embodiment of the invention. In this embodiment, a probe body 412 is reversible relative to a test lead 406. The probe body 412 has a first end 404 and a second end 408. A first probe tip 420 extends from the first end 404 of the probe body 412. A second probe tip 422 extends from the second end 408 of the probe body 412. The probe tips 420 and 422 are made from an electrically conductive material and are in electrical communication with one another. In some embodiments, the probe tips 420 and 422 are formed from the same conductive member that extends through the probe body 412. The probe body 412 is made from an insulative material, such as plastic. In one embodiment, the first end 404 of the probe body 412 has a first finger guard 436 and the second end 408 has a second finger guard 437.

The test lead 406 is configured to receive both the first probe tip 420 and the second probe tip 422. In particular, the test lead 406 has an opening 424 at surface 440, which extends longitudinally along the test lead 406. The opening 424 extends into the test lead 406 to a depth that is sufficient to receive the longest probe tip. The opening 424 in the embodiment of FIG. 4 is initially tapered with the diameter of the opening consistently changing until marker 425. At marker 425 the opening 424 maintains a relatively constant diameter until the opening ends. As will be clear to a person having ordinary skill in the art, the opening can have any shape that can accept a portion of the first label portion 421 and first probe tip 420 and second label portion 423 and second probe tip 422.

Within the opening is a metal device 428, such as a metal band, to electrically couple the test lead 406 to either the first probe tip 420 or the second probe tip 422 depending on which probe tip is inserted into the opening 424 of the test lead 406. In the embodiment shown in FIG. 4, the metal device 428 is similar to the metal device 228 in FIG. 2. As in FIG. 2, the metal device in FIG. 4 has threads 430 that can mate with threads 433 on the first probe tip 420 and threads 432 on the second probe tip 422. However, as explained with reference to the metal device of FIG. 2, the metal device 428 in FIG. 4 may have any configuration that allows for electrical communication with the first and second probe tips 420 and 422. Therefore, the test probe assembly 402 allows a user to change probe tips by simply removing the first end 404 of the test probe body 412 from the test lead 406 and insert the second end 408 into the test lead 406.

In yet another embodiment, the reversible probe 402 has a reversible probe tip 216 from FIG. 2 at the first end 404 of the probe 402 and/or at the second end 408 of the probe 402. This provides the user with the opportunity to have four varying sized probe tips available on the probe 402 itself.

Figure 5:
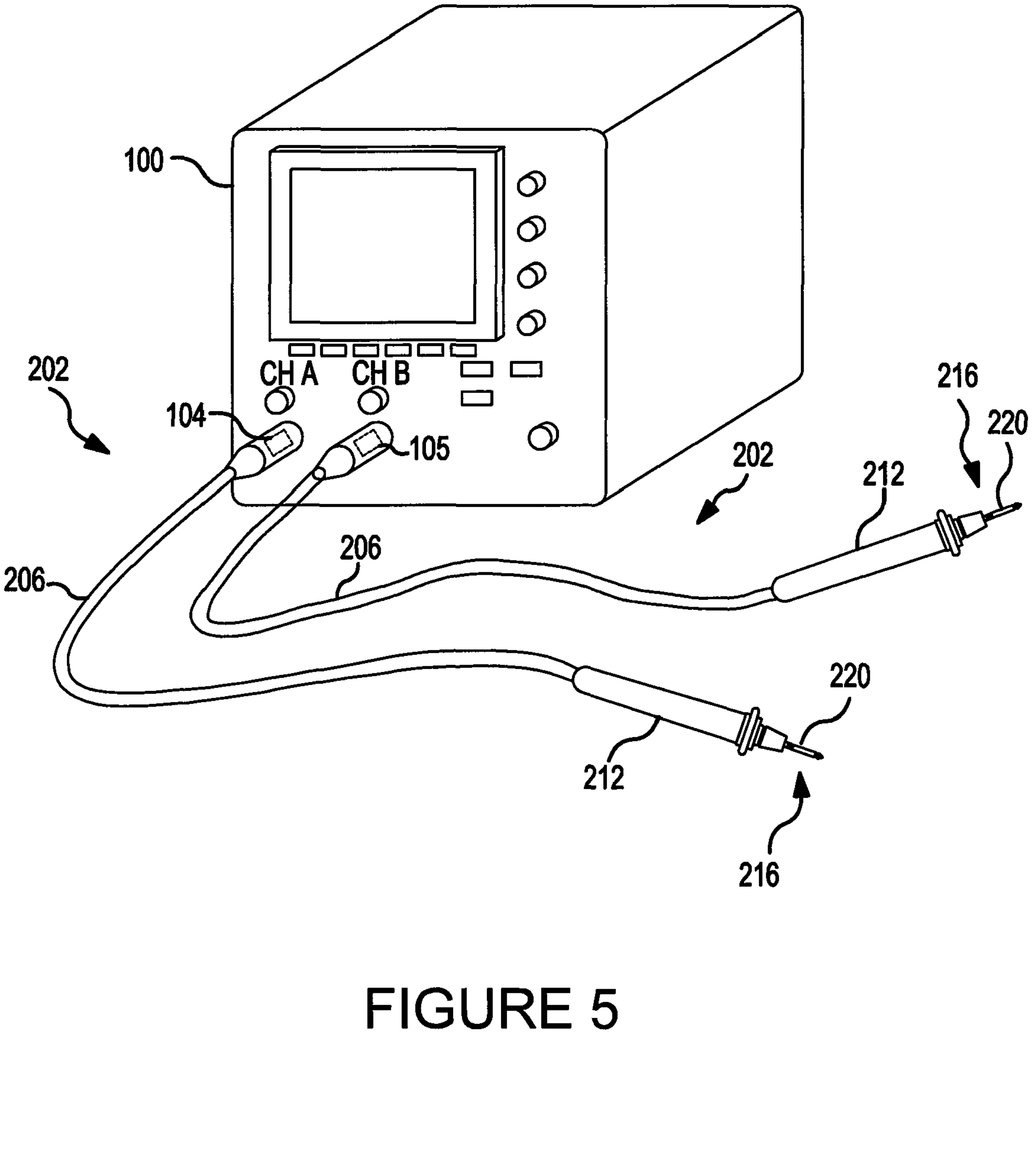
FIG. 5 is a schematic drawing of a test instrument including a test probe according to one embodiment of the invention.

FIG. 5 shows the test instrument 100 in FIG. 1 having a test probe 202 of FIG. 3A coupled to each output 104 and 105 of the test instrument 100. In this embodiment, the test probe tips 216 are oriented so that the first probe tip 220 is exposed for coupling to a test point (not shown) and the second probe tip 222 is enclosed within the probe body 212.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

What is claimed is:

1. A test probe, comprising:

a test lead;

a probe body having a distal end and a proximal end, the probe body coupled to the test lead at the distal end, the probe body having an opening at the proximal end that extends along a portion of the length of the probe body;

a reversible probe tip including a conductive member having a first electrically conductive tip at a first end and a second electrically conductive tip at a second end, the second electrically conductive tip having a length different than the length of the first electrically conductive tip, the reversible probe tip further including a first coupling device proximate the first end configured to be positioned in the opening of the probe body, a second coupling device proximate the second end configured to be positioned in the opening of the probe body, and at least one finger guard positioned between the first coupling device and the second coupling device; and a conductive structure positioned within the opening of the probe body, the conductive structure having screw threads configured to mate with the first coupling device to provide mechanical and electrical communication between the test lead and the first tip when the first tip is positioned within the opening and to mate with the second coupling device to provide mechanical and electrical communication between the test lead and the second tip when the second tip is positioned within the opening, the first coupling device configured to be positioned outside the opening of the probe body when the second coupling device mates with the screw threads and the second coupling device configured to be positioned outside of the opening of the probe body when the first coupling device mates with the screw threads.

2. The test probe of claim 1 wherein the first and second coupling devices are threaded to mate with the screw threads.

3. Test instrument, comprising:

an output terminal;

a test lead coupled to the output terminal;

a probe body coupled to the test lead, the probe body having a recess;

a coupling device positioned within the probe body, the coupling device providing electrical communication to the output of the test instrument; and a reversible probe tip assembly having a first probe tip at a first end, the first end having a first coupling connector, the reversible probe tip assembly further having a second probe tip at a second end, the second end having a second coupling connector separate from the first coupling connector, the first and second probe tips having different lengths, the first probe tip configured to be positioned within the recess of the probe body so that the first coupling connector is mechanically and electrically coupled through screw threads to the coupling device within the probe body while the second coupling connector is positioned outside of the recess, the second probe tip configured to be positioned within the recess of the probe body so that the coupling connector is mechanically and electrically coupled through the screw threads to the coupling device in the probe body while the first coupling connector is positioned outside of the recess.

4. The test instrument of claim 3 wherein the first coupling connector has threads that mate with the screw threads positioned within the probe body.

5. The test instrument of claim 3 wherein the first probe tip is longer than the second probe tip.

6. The test probe of claim 3 wherein the first coupling connector is further configured to be exposed when positioned outside the opening of the probe body and the second coupling connector configured to be exposed when positioned outside of the opening of the probe body.

7. A test probe, comprising:

a conductive member having a first portion and a second portion, the first portion including a distal end of the conductive member, the second portion including a proximal end of the conductive member, the distal end defining a first electrically conductive tip and the proximal end defining a second electrically conductive tip having a length different than the length of the first electrically conductive tip, the first portion including a first coupling device, the second portion including a second coupling device;

a test lead having a recess operable to receive the first tip and the second tip, the test lead including a coupling member in the recess, the coupling member configured to electrically and mechanically couple through screw threads to the first coupling device of the first portion when the first tip is positioned in the recess and electrically and mechanically couple through the screw threads to the second coupling device of the second portion when the second tip is positioned in the recess; and an insulative member surrounding a portion along the length of the conductive member and positioned between the first coupling device and the second coupling device, the insulative member positioned outside of the recess when the first and second tips are positioned in the recess.

8. The test probe of claim 7 wherein the distal end defining the first tip is configured differently from the proximal end defining the second tip.

9. The test probe of claim 7 wherein the first tip is secured to the test lead when the first tip is positioned in the recess and the second tip is secured to the test lead when the second tip is positioned in the recess.

10. The test probe of claim 7 wherein the screw threads mate with threads on a portion of the first tip when the first tip is positioned in the recess that mate with threads on a portion of the second tip when the second tip is positioned in the recess.

11. The test probe of claim 7 wherein the insulative member comprises a first label portion that describes the first tip and a second label portion that describes the second tip.

12. The test probe of claim 7 wherein the insulative member comprises at least one finger guard.

13. A method of securing a test probe tip in a test probe body, the test probe tip comprising a conductive member, the conductive member including a first coupling component proximate a first end and a second coupling component proximate a second end, the test probe tip further including an insulative sleeve surrounding a portion of the conductive member and positioned between the first and second coupling components, the method comprising:

placing the first end of the test probe tip and the first coupling component into the test probe body so that the second end of the test probe tip and the second coupling component extends from the test probe body;

rotating the test probe tip in a first direction to mechanically and electrically secure the first coupling component of the test probe tip to a third coupling component of the test probe body;

rotating the first end of the test probe tip in an opposite direction to unsecure the first coupling component of the first end of the test probe tip from the third coupling component of the test probe body;

removing the first end of the test probe tip from the test probe body;

placing the second end of the test probe tip and the second coupling component into the test probe body so that a first end of the test probe tip and the first coupling component extends from the test probe body; and rotating the second end of the test probe tip in the first direction to mechanically and electrically secure the second coupling component of the test probe tip to the third coupling component of the test probe body.

14. A method of testing devices using a test probe tip, the test probe tip comprising a conductive member, the conductive member including a first coupling component proximate a first end and a second coupling component proximate a second end, the test probe tip further including an insulative sleeve surrounding a portion of the conductive member and positioned between the first and second coupling components, the method comprising:

placing the first end and the first coupling component of the test probe tip into a test probe body to mechanically and electrically secure the test probe tip to a third coupling component in the test probe body so that the second end and the second coupling component of the test probe tip extend from the test probe body;

placing the second end of the test probe tip in electrical communication with a first test point of a first device to be tested;

removing the first end of the test probe tip from the test probe body;

placing the second end and the second coupling component of the test probe tip into the test probe body to mechanically and electrically secure the test probe tip to the third coupling component in the test probe body so that the first end of the test probe tip and the first coupling component extend from the test probe body; and placing the first end of the test probe tip in electrical communication with a second test point of a second device to be tested.

15. The method of claim 14, wherein the first test point is different from the second test point.

16. The method of claim 14, wherein the first device is different from the second device.

* * * * *

UNITED STATES PATENT AND TRADEMARK OFFICE
CERTIFICATE OF CORRECTION

PATENT NO. : 7,902,848 B2
APPLICATION NO. : 12/351696
DATED : March 8, 2011
INVENTOR(S) : L. Eccleston et al.

It is certified that error appears in the above-identified patent and that said Letters Patent is hereby corrected as shown below:

| **COLUMN** | **LINE** | **ERROR** |
|---|---|---|
| 7<br>(Claim 10, | 32<br>line 3) | "positioned in the recess that mate" should read<br>--positioned in the recess and wherein the screw threads mate-- |

Signed and Sealed this
Fourth Day of September, 2012

David J. Kappos
*Director of the United States Patent and Trademark Office*